United States Patent [19]
Osakabe et al.

[11] Patent Number: 5,836,381
[45] Date of Patent: Nov. 17, 1998

[54] COOLING APPARATUS USING BOILING AND CONDENSING REFRIGERANT

[75] Inventors: Hiroyuki Osakabe, Chita-gun; Takashi Furukawa, Nagoya; Kiyoshi Kawaguchi, Toyota; Masahiko Suzuki, Hoi-gun; Manji Suzuki, Chiryu, all of Japan

[73] Assignee: Nippondenso Co., Ltd., Kariya, Japan

[21] Appl. No.: 927,176

[22] Filed: Sep. 11, 1997

Related U.S. Application Data

[63] Continuation of Ser. No. 504,025, Jul. 19, 1995, abandoned.

[30] Foreign Application Priority Data

| Jul. 19, 1994 | [JP] | Japan | 6-167024 |
| Jul. 19, 1994 | [JP] | Japan | 6-167025 |
| Jul. 19, 1994 | [JP] | Japan | 6-167026 |
| Jan. 13, 1995 | [JP] | Japan | 7-003646 |

[51] Int. Cl.⁶ ................................ F28D 15/00
[52] U.S. Cl. .................. 165/104.21; 165/104.23; 257/715; 361/700
[58] Field of Search ............... 165/104.33, 104.21, 165/80.4; 361/201, 700, 698; 257/715

[56] References Cited

U.S. PATENT DOCUMENTS

| 3,209,062 | 9/1965 | Scholz | 165/104.33 X |
| 3,476,175 | 11/1969 | Plevyak | 165/104.33 X |
| 4,312,012 | 1/1982 | Frieser et al. | 165/80.4 X |
| 4,830,100 | 5/1989 | Kato et al. | 165/104.33 X |
| 4,893,590 | 1/1990 | Kashimura et al. | 165/80.4 X |
| 5,223,747 | 6/1993 | Tschulena | 361/700 X |
| 5,390,077 | 2/1995 | Paterson | 361/700 |
| 5,409,055 | 4/1995 | Tanaka et al. | 361/700 X |
| 5,613,552 | 3/1997 | Osakabe et al. | |

FOREIGN PATENT DOCUMENTS

| 1254506 | 12/1968 | Germany | 165/104.33 |
| 2543075 | 7/1996 | Germany | 361/700 |
| 51-15843 | 2/1976 | Japan . | |
| 53-35661 | 9/1978 | Japan . | |
| 55-51345 | 12/1980 | Japan . | |
| 5-326774 | 12/1993 | Japan . | |
| 1261029 | 9/1986 | U.S.S.R. | 257/715 |

Primary Examiner—Ira S. Lazarus
Assistant Examiner—Christopher Atkinson
Attorney, Agent, or Firm—Cushman Darby & Cushman IP Group of Pillsbury Madison & Sutro LLP

[57] ABSTRACT

A radiation part, a refrigerant tank having heating elements mounted thereon, and an inverter case are bonded together by welding or brazing. A cooling fan is provided at the back surface of the radiation part. IGBT modules are fastened to a side surface of the refrigerant tank and further fastened together to the inverter case together. A press worked thin plate materials are bonded together to the refrigerant tank by brazing. The IGBT modules, which are heating elements, are mounted to the inverter case by bolts through the component materials of the refrigerant tank. According to this invention, as these components can be fixed in a very simple construction without using any seat cock, the manufacturing cost thereof can be reduced.

22 Claims, 14 Drawing Sheets

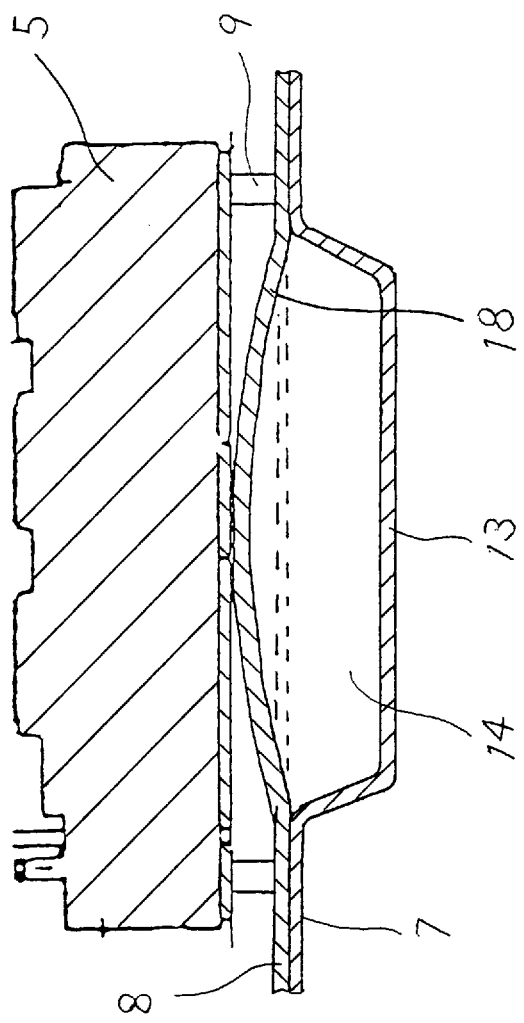

COOLING APPARATUS USING BOILING AND CONDENSING REFRIGERANT

This is a continuation of application Ser. No. 08/504,025, filed on Jul. 19, 1995, which was abandoned upon the filing hereof.

CROSS REFERENCE TO RELATED APPLICATIONS

This application is based upon and claims priority from Japanese Patent Application No. 6-167024 filed Jul. 19, 1994, Japanese Patent Application No. 6-167025 filed Jul. 19, 1994, Japanese Patent Application No. 6-167026 filed Jul. 19, 1994, and Japanese Patent Application No. 7-3646 filed Jan. 13, 1995, with the contents of each document being incorporated herein by reference.

BACKGROUND OF THE INVENTION

1. Field of the Invention

The present invention generally relates to a cooling apparatus using boiling and condensing apparatus. More particularly, the present invention relates to a cooling apparatus using boiling and condensing apparatus for electric vehicles and general-purpose inverters.

2. Description of the Related Art

As a cooling apparatus using boiling and condensing apparatus in which an inverter and a heating element, such as IGBT (Insulated-Gate Bipolar Transistor) module, are closely adhered and fixed to a refrigerant tank for cooling the heat generated by the heating element, a typical conventional structure has been disclosed in the Japanese Examined Patent Publication No. 53-35661 in which a heating element, such as IGBT module, is closely adhered and fixed to a refrigerant tank for cooling the heat generated by the heating element.

However, for the cooling apparatus using boiling and condensing apparatus disclosed in the above Japanese Examined Patent Publication No. 53-35661, as the refrigerant tank is manufactured by machining or die casting, there are drawbacks of heavy weight, and low productivity and high cost of manufacturing.

Another cooling apparatus using boiling and condensing apparatus has been disclosed in the Japanese Examined Patent Publication No. 55-51345 in which a plurality of press worked thin plates are bonded together so that a refrigerant tank on which a heating element is fixed and a radiation part which receives heat from a boiled, gasified and elevated refrigerant and releases the heat to the outside can integrally be formed.

However, in the boiling and cooling system as disclosed in the Japanese Examined Patent Publication No. 55-51345, as the refrigerant tank and the radiation part are integrally formed, there is a problem of insufficient radiation area of the radiation part and the consequent degradation of the radiation characteristics.

Furthermore, in the cooling apparatus as disclosed in the Japanese Examined Patent Publication No. 55-51345, the heating element is buried in the refrigerant tank. However, if a differently shaped heating element is tried to be fixed into the refrigerant tank for widening the applicability, the refrigerant tank itself has to be reshaped. Moreover, if the heating element is fixed on the refrigerant tank by bonding or brazing, the heating element may be detached from the refrigerant tank at the bonded or brazed part due to the difference in the coefficient of thermal expansion between the heating element and the refrigerant tank. Considering this problem, if the widening of the applicability and the reduction of the manufacturing cost are pursued at, it is advisable that the heating element should be fixed by screws.

Nevertheless, in the cooling apparatus disclosed in the Japanese Examined Patent Publication No. 53-35661, when the heating element is fixed on the refrigerant tank, if a fixing screw penetrates into the refrigerant tank, there are problems of the leaking of the refrigerant from the refrigerant tank and the degradation of airtightness, such as air leaks. In order to counter these problems, the thickness of the screw fastening part of the refrigerant tank should be increased to approximately 15 mm. In machining or die casting the refrigerant tank, this can be achieved by the provision of a boss to the screw fastening part. However, with machining and die casting, there are problems of high manufacturing cost and heavy weight. On the other hand, in the cooling apparatus disclosed in the Japanese Examined Patent Publication No. 55-51345, there is a method whereby a seat cock (a block having screw holes) or the like is bonded on the refrigerant tank having a thin wall thickness by brazing to make screw fastening possible. However, in general, as at least four screws are required for one heating element, there are problems of the increase in cost due to a seat cock component, bonding by brazing, and the degradation of airtightness by the bonding of the seat cock having screw holes on the refrigerant tank having holes and the consequent leaking of the refrigerant.

SUMMARY OF THE INVENTION

In view of the above, a primary object of the present invention is to obtain a cooling apparatus which can reduce the manufacturing cost and prevent the degradation of the heat radiation characteristics. Another object of the present invention is to obtain a cooling apparatus which can prevent the degradation of the airtightness even when a heating element is fixed by screws.

In one preferred mode of the present invention, a cooling apparatus using boiling and condensing refrigerant for cooling heating elements generating heat includes a refrigerant tank formed by joining a plurality of thin plate materials together in which the refrigerant is sealed, each of the plurality of thin plates having a joining portion, the joining portion having at least a through hole, the heating elements being disposed on the thin plate material, the refrigerant adsorbing heat generated from the heating element and being gasified, a radiation part of tubular shape mounted on the refrigerant tank with one opening completely closed and the other opening communicated with the refrigerant tank for cooling and liquefying the gasified and elevated refrigerant and returning the liquefied refrigerant into the refrigerant tank, a fastening member for fastening each the heating element through the through hole at the joining portion.

According to the present invention, there is no need to use machining or die casting, the increase in the weight of the refrigerant can be prevented, and the productivity can be improved. Furthermore, as the refrigerant tank and the radiation part are separately formed, the radiation part can be enlarged, and therefore, the heat radiation area of the radiation part can be secured.

Furthermore, according to the present invention, the refrigerant tank is formed by the bonding of the thin materials together so that the wall surfaces of the refrigerant tank in opposition to each other can closely be adhered to each other at the fastening area on which the heating elements are mounted. Therefore, the manufacturing process is simple, and the demands for both the cost reduction and the airtightness improvement can be achieved at the same time.

Moreover, the through holes are made in the fastening area at the joining portion, and the heating elements are fixed on the refrigerant tank by fastening materials though the through holes. As the thin materials are bonded together at the joining portion, even if the through holes are made therein, there is no possibility of refrigerant leaking from the refrigerant tank. Therefore, even if the heating elements are fixed on the refrigerant tank by the fastening members, the airtightness can be maintained.

BRIEF DESCRIPTION OF THE DRAWINGS

FIG. 12 is a cross sectional view of the IGBT module and mounting surface of a fifth embodiment of the cooling apparatus;

DETAILED DESCRIPTION OF THE PREFERRED EMBODIMENTS

The contents of the present invention will be described referring to embodiments.

[EMBODIMENT 1]

Figure 1:
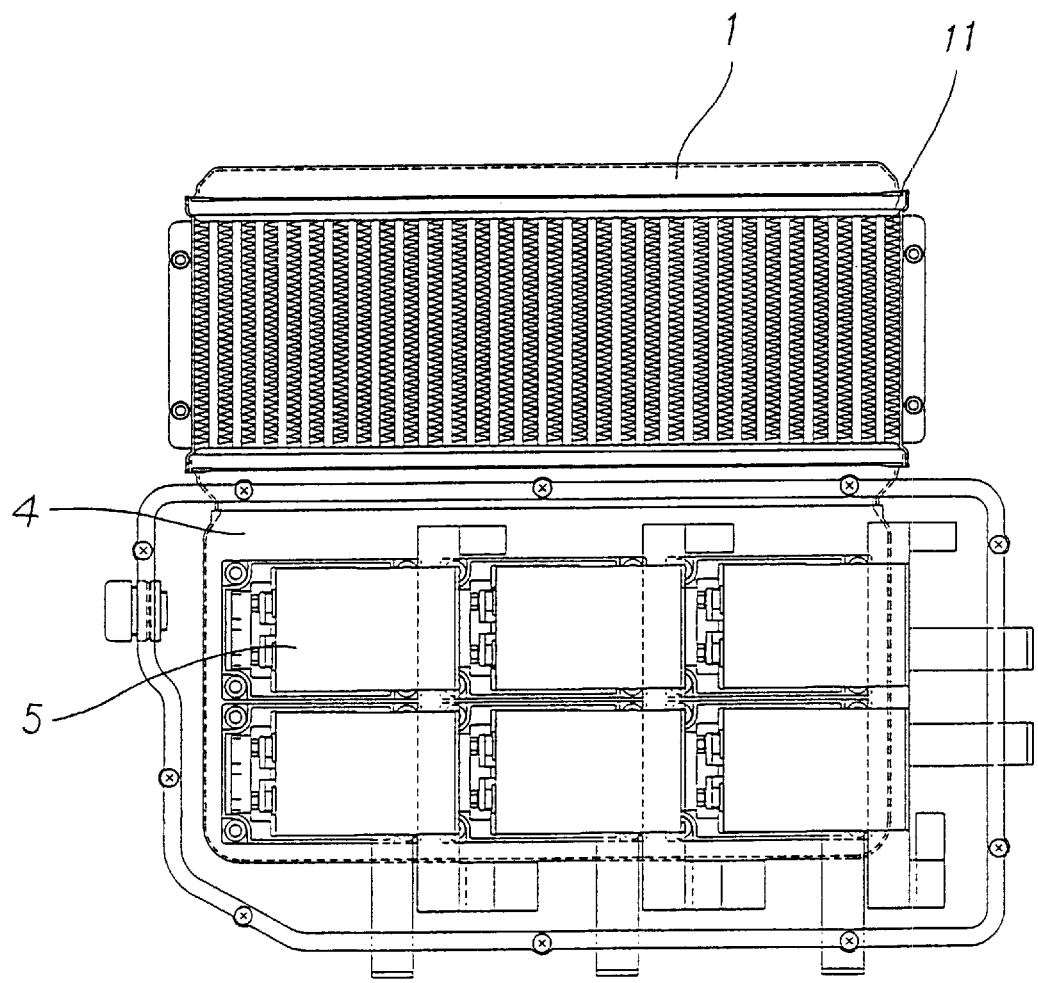
FIG. 1 is a partially cutaway front view to illustrate a cooling apparatus with heating elements of a first embodiment according to the present invention.
Figure 2:
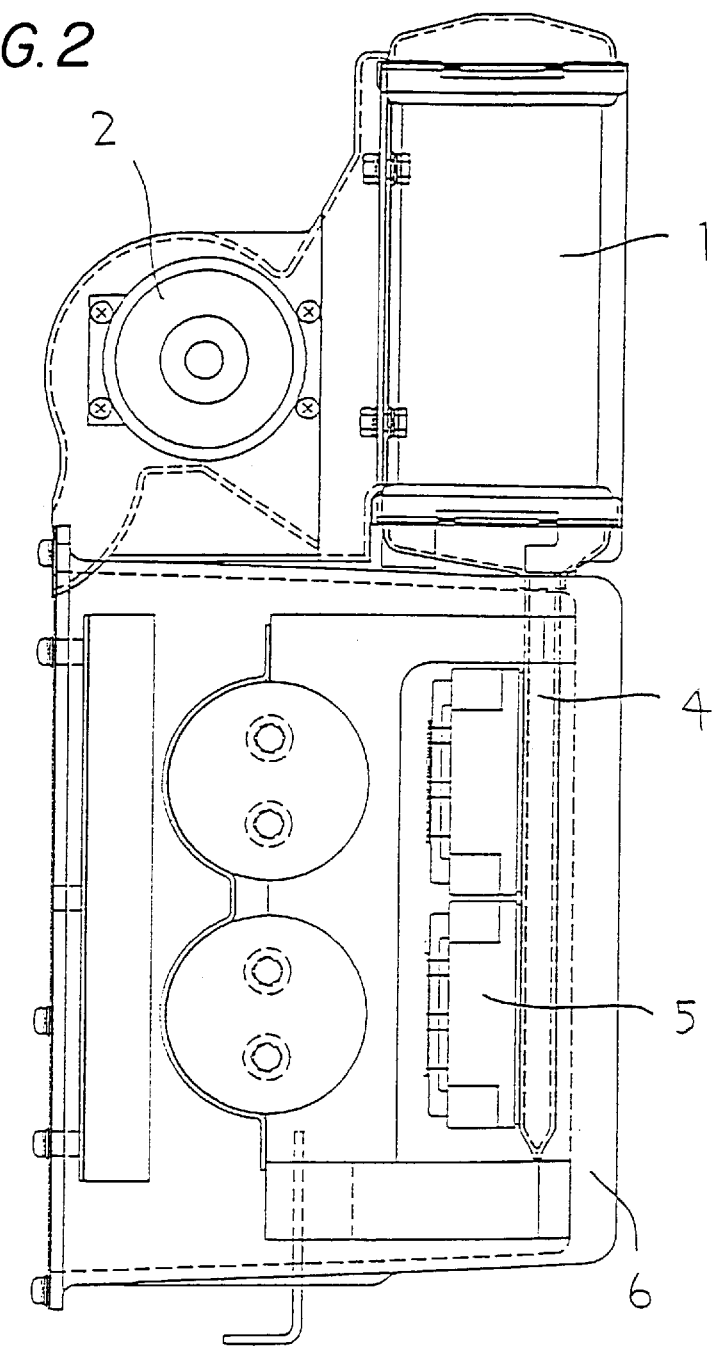
FIG. 2 is a side view of the cooling apparatus.
Figure 3:
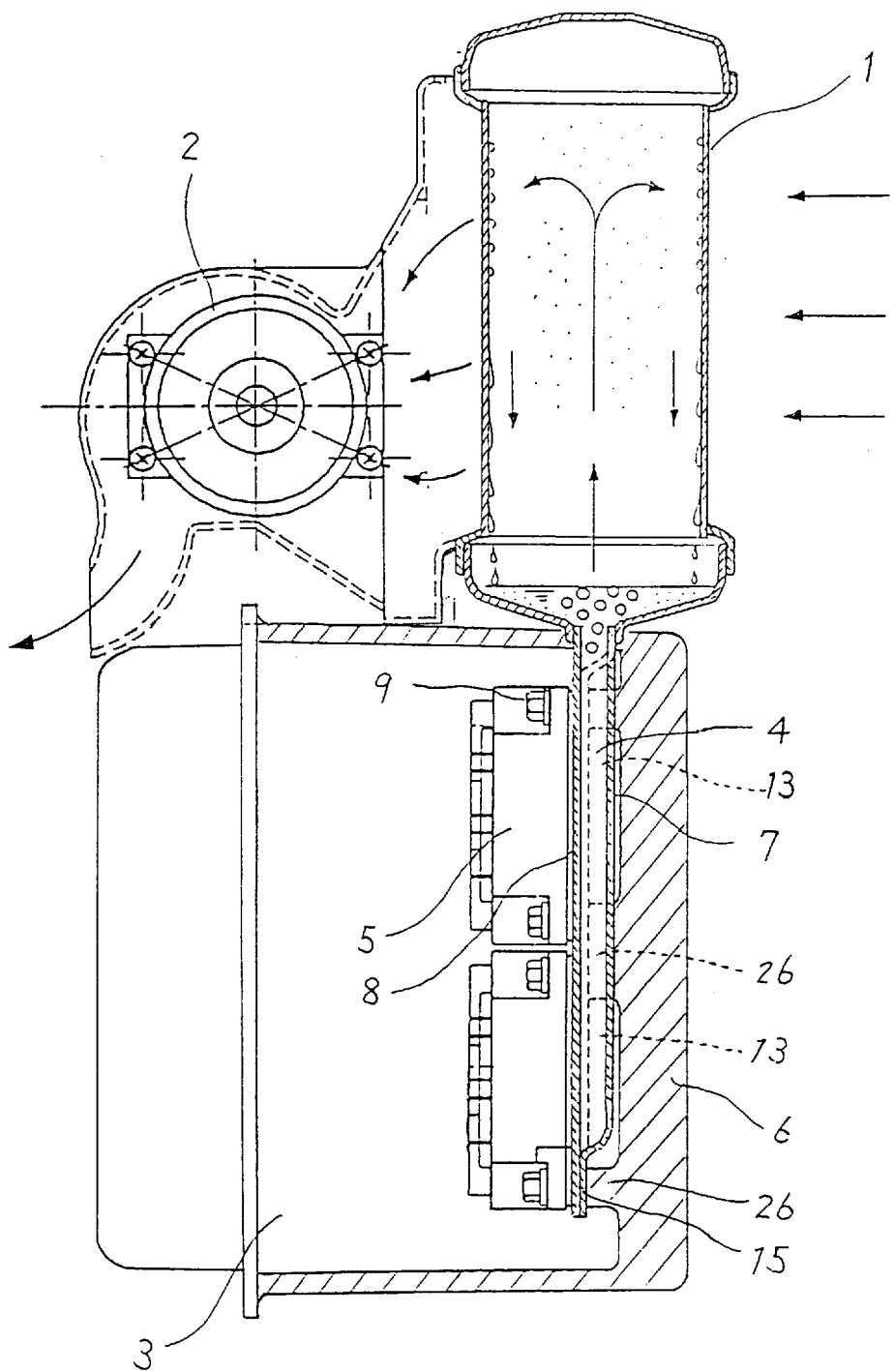
FIG. 3 is a cross sectional side view of the cooling apparatus of the first embodiment according to the present invention.
Figure 4:
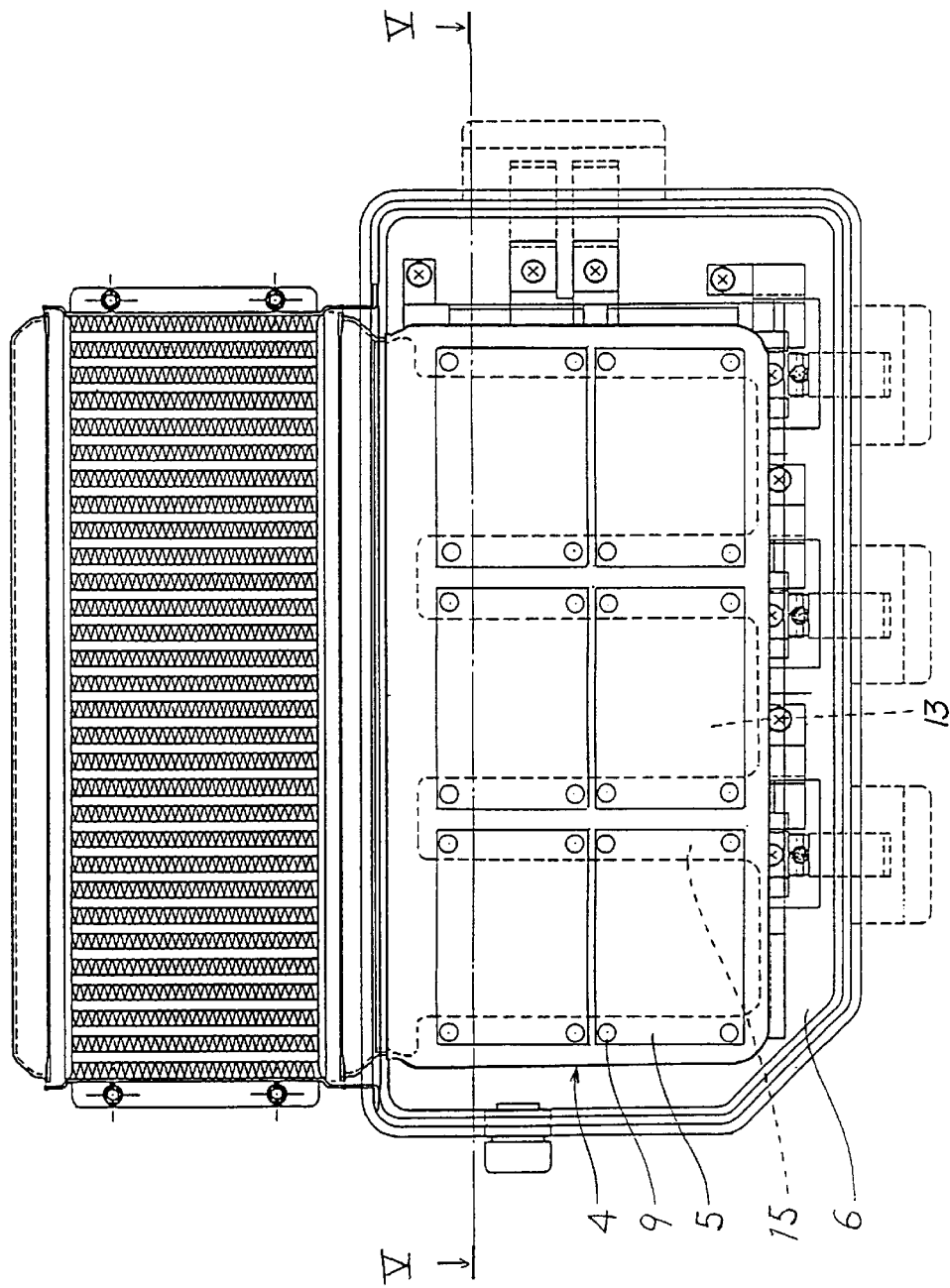
FIG. 4 is a partial perspective front view illustrating a recessed formation.
Figure 5:
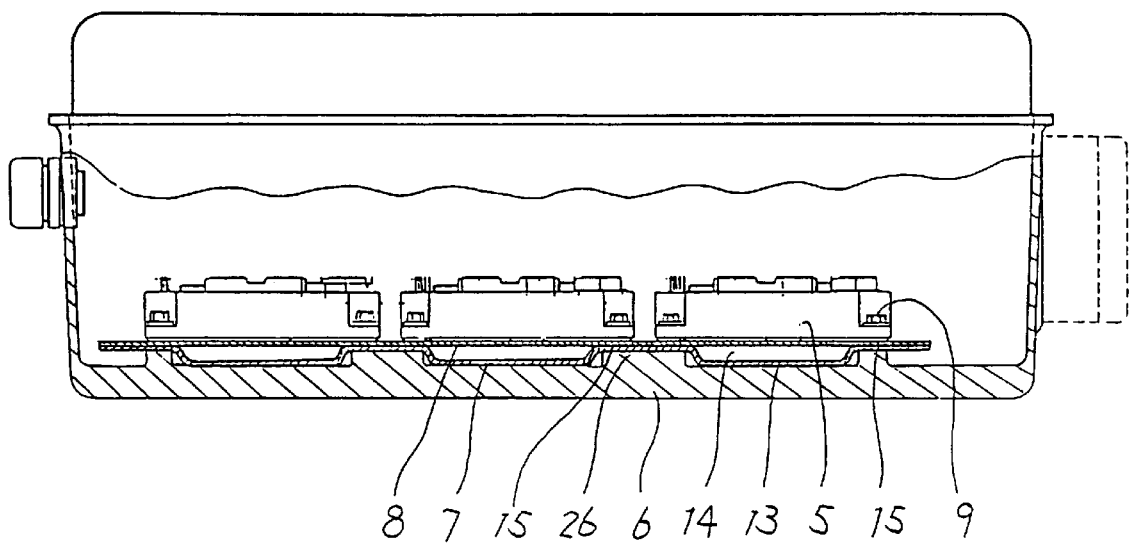
FIG. 5 is a cross sectional view taken along the line V—V in FIG. 4.

An embodiment of the present invention is shown in FIGS. 1 through 5. This embodiment is an example of an application of the present invention to a cooling apparatus integrated type inverter for electric vehicles. FIG. 1 is a partially cutaway front view of the cooling apparatus of this embodiment, and FIG. 2 is a side view thereof. FIG. 3 is a cross sectional view illustrating the construction of this embodiment. FIGS. 4 and 5 are prepared for making a recessed part and a joining portion understandable.

First of all, the construction of a cooling apparatus integrated type inverter for electric vehicles is explained below. A radiator part 1, a refrigerant tank 4 on which a heating element is mounted, and an inverter case 6 are bonded together by welding or brazing. A cooling fan 2 is mounted on the back surface of the radiation part 1. IGBT modules 5 as heating elements are mounted on a side surface of the refrigerant tank 4 at two levels and fastened to the inverter case 6 together with the refrigerant tank 4. Here, the refrigerant tank 4 is flat in cross section thereof, and mounted under the radiation part 1 to communicate in their inside mutually so that the flat cross section can extend in the same direction as the axial direction (up/down direction) of the radiation part 1.

Next, the structure of this embodiment will be detailed referring to FIG. 3. In FIG. 3, the refrigerant tank 4 is composed of press worked thin plate materials 7 and 8, both of which being bonded together by brazing. The IGBT modules 5 are mounted on the inverter case 6 through the plate materials 7 and 8 of the refrigerant tank 4 by using bolts 9. Inside of the inverter case 6 is hollow and space 3 is formed a lot ahead of the the IGBT modules 5. In this way, in the IGBT modules 5 are mounted on the outer part of the refrigerant tank 4, and furthermore, the IGBT modules 5 are covered with a structural member which catches and fixes the refrigerant tank 4 between the IGBT modules 5 and the structural member.

Cooling fins composed of corrugate fins 11 are mounted on a side surface of the radiation part 1. Also, a fan 2 for forcedly blowing cooling air should preferably be mounted on a side surface of the radiation part 1. In this embodiment, a cross flow fan 2 is used as the forced cooling fan, but an axial flow fan may be used instead.

As described above, in this embodiment, as the refrigerant tank 4 is formed by the bonding of the thin plate materials 7 and 8 together, a joining portion 15 is formed around bonded thin plate materials 7 and 8. The inverter case 6 has a protruded portion 26 to mount the joining portion 15. Between the protruded portions 26 the inverter case 6 is recessed.

In this embodiment, there is no need to use cutting or die casting for manufacturing the refrigerant tank 4. This can reduce the weight of the refrigerant tank 4 and improve the productivity of the manufacturing thereof. Furthermore, as the refrigerant tank 4 and the radiation part 1 are separately formed, the radiation part 1 can be formed to a large size, and the heat radiation area of the radiation part 1 can be secured.

Figure 6:
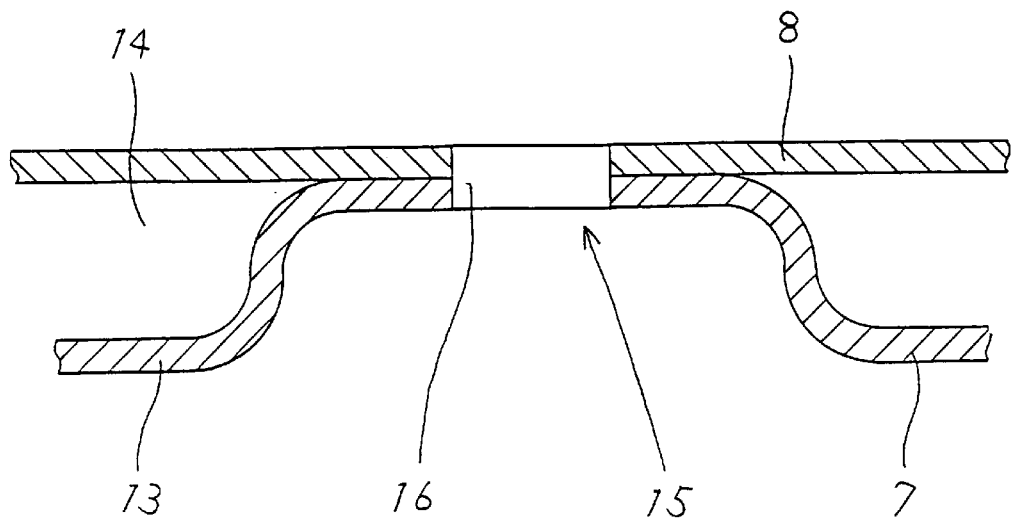
FIG. 6 is a partially enlarged view illustrating the detail structure of joining portion.

A recessed part 13 of the refrigerant tank 4 of FIG. 3 is formed along the shape of recessed inverter case 6 between the protruded portions 26 and also illustrated in FIG. 4. In FIG. 4, broken lines show the recessed part 13 and the joining portion 15 formed on the thin plate materials 7 and 8. Both surfaces opposing mutually of the thin plate materials 7 and 8 are bonded together by brazing at the joining portion 15, and through holes are formed in the joining portion 15 at only a small portion for screw parts. For better understanding, a cross section taken along line V—V of FIG. 4 is illustrated in FIG. 5. Chambers 14 filled with refrigerant on the back surfaces of the IGBT modules are formed between the recessed portion 13 of the thin plate material 7 and the thin plate material 8. Bolts 9 penetrate the through holes and fasten the joining portion 15 and the IGBT module 5 to the protruded portion 26 of the inverter case 6. As this embodiment makes it possible to fix the IGBT modules 5 in a very simple construction without using any seat cock, the manufacturing cost can be reduced. FIG. 6 illustrates the structure of the joining portion 15 in detail. The thin plate materials 7 and 8 are joined around the joining portion 15. As a periphery of the through hole 16 in the joining portion 15 is bonded together by brazing or the like, the airtightness thereof can be maintained even after fastening the bolts.

Furthermore, since the recessed and joining portion illustrated in FIG. 4 which have areas large enough to fix a plurality of the IGBT modules 5 are provided to the refrigerant tank 4, the rigidity of the whole refrigerant tank 4 and IGBT module mounting surfaces can be improved, and the improvement in the durability of the entire refrigerant tank 4 and IGBT module mounting surfaces and the reduction of the mounting heat resistance can be expected.

Moreover, in such a structure as illustrated in FIG. 4, since the refrigerant tank 4 is divided into three cooling chambers, when this structure is applied particularly to the product use conditions under which the vibration/inclination of an electric vehicle or the like exists, such divided structure can restrain the upheaval of the refrigerant levels to the advantage of such application.

[EMBODIMENT 2]

Figure 7:
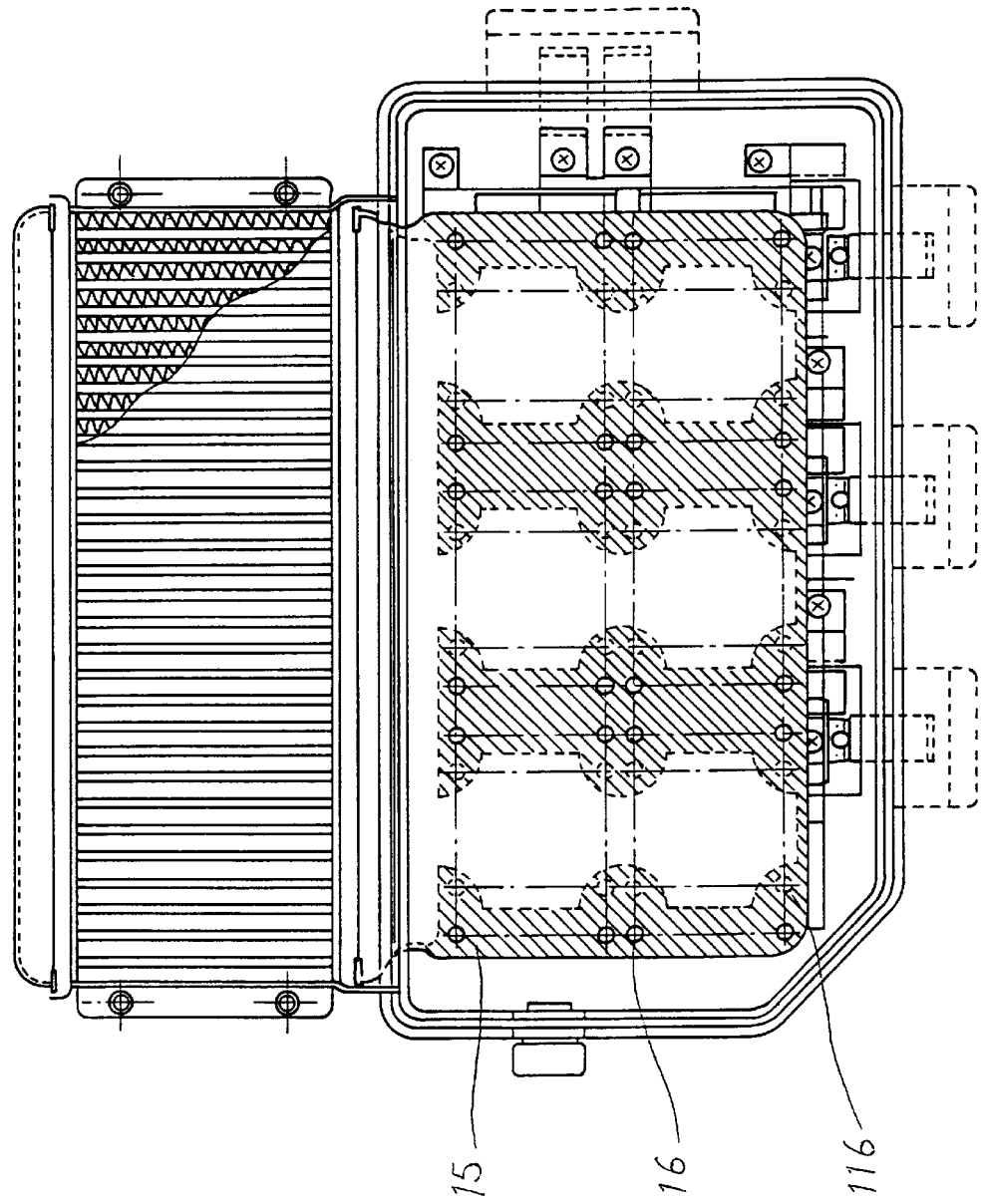
FIG. 7 is a partial perspective front view illustrating a recessed formation of a second embodiment.

FIG. 7 shows a second embodiment. The joining portions 15 having the through holes 16 are widened as shown in FIG. 7. The joining portions 15, hatched in FIG. 7, are widened more than the other areas so that through holes 116 having different intervals shown with dot lines are formed on the joining portion 15 with securing airtightness. Specifically, in FIG. 7, it is possible that the through holes 16 indicated in solid lines are formed for mounting the IGBT modules 5 having the ordinary fastening intervals and the through holes 116 indicated in broken lines can be applicable for mounting the IGBT modules 5 having shorter intervals. Therefore, the IGBT modules having 5 different fastening intervals can be mounted, and production cost can be reduced due to the versatility. Furthermore, the heating elements 5 of different types can be mounted on the same refrigerant tank 4. Therefore, if the present invention is applied to an electric vehicle or the like having power semiconductor elements which operate with various timings, efficient cooling can be achieved.

On the other hand, according to this embodiment, in a cooling apparatus comprising a refrigerant tank formed by bonding thin plate materials together and heating elements fixed on a side of the refrigerant tank by screws or bolts, it is acceptable that the surfaces of the fixing parts of the thin materials through which the heating elements are fixed to the refrigerant tank are roughly formed and the thin materials are bonded together at the fixing parts by brazing.

As described above, in this embodiment, arresting attention to the fact that there is no problem with a comparatively flat refrigerant tank of a cooling apparatus having heating elements disposed in the upright positions, only the screw fastening parts through which IGBT modules in opposition to the refrigerant tank are formed to be recessed and bonded together by brazing on one hand, and through holes are made in the recessed parts and the refrigerant tank is caught between a structure material for mounting the entity of the cooling apparatus and the IGBT modules and fixed through such through holes, and thereby a seat cock or other fastening means can be dispensed with. As a result, both demands for manufacturing cost reduction and airtightness improvement can be satisfied at the same time.

[EMBODIMENT 3]

Figure 8:
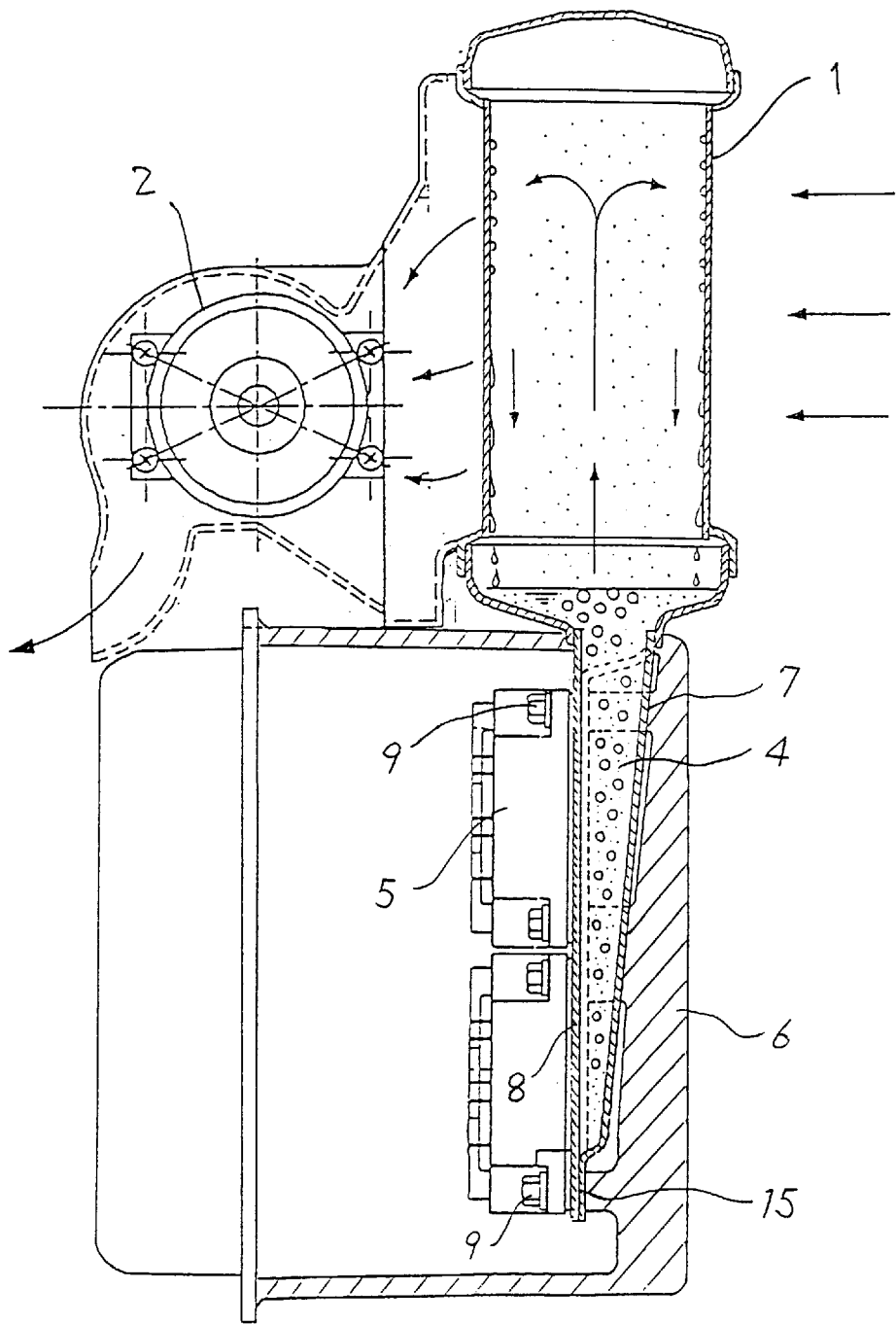
FIG. 8 is a cross sectional side view of the cooling apparatus of a third embodiment according to the present invention.

The third embodiment according to the present invention is illustrated in FIG. 8. This embodiment is also an example of a cooling apparatus for integrated type inverter for electric vehicles. This embodiment also has the same front view of FIG. 1 and the same construction as the first embodiment excluding the following construction. Therefore, the explanation regarding the front view of this apparatus is omitted.

FIG. 8 is a cross sectional side view of the apparatus of this embodiment.

The refrigerant tank 4 is constructed by the bonding of press worked thin composition materials 7 and 8 by brazing. The IGBT modules 5 are mounted on the inverter case 6 through the thin plate materials 7 and 8 for the refrigerant tank 4 by bolts 9.

By arranging the thin plate materials 7 and 8 to be narrower toward the lower part and wider toward the upper part as illustrated in FIG. 8, in other words, the thin plate materials 7 and 8 are tapered off to the joining portion 15 at the end, it can prevent air bubbles generated in the lower part of the refrigerant tank 4 from degrading the heat radiation ability on a heat radiation surface of the thin plate material 8 contacting with the IGBT module. As a result, even if the IGBT modules 5 are mounted at two levels in the depth direction of the refrigerant tank 4, air bubbles generated on the heat radiation surface of the IGBT modules 5 in the lower part are prevented from being impregnated at the heat radiation surface of the upper part of the IGBT or from interfering air bubbles in the upper part mutually. Therefore, the heat radiation from the upper IGBT module 5 is achieved effectively. Furthermore, when the upper and lower IGBT modules are arranged in parallel with each other for use with the even cooling in the up/down direction, the present invention can improve the temperature balance of the IGBT modules 5, and therefore becomes particularly useful.

Furthermore, even if the refrigerant tank 4 is manufactured by die casting or the like, this embodiment can serve as a draft, the productivity can be improved.

[EMBODIMENT 4]

Figure 9:
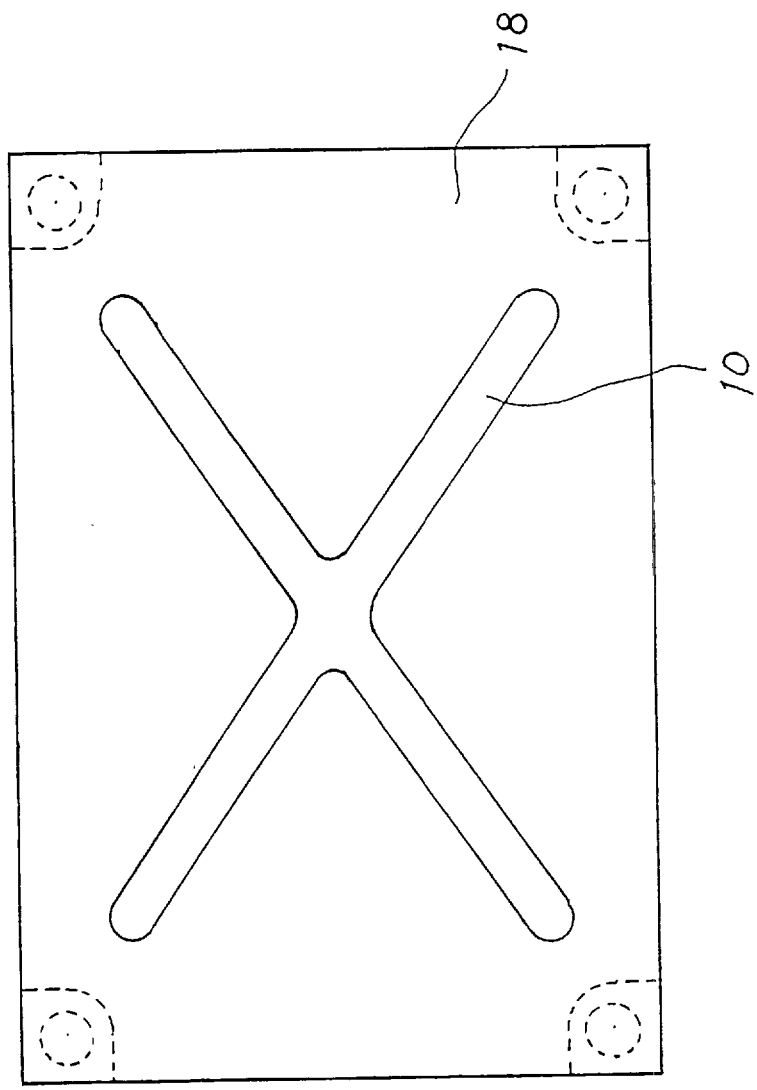
FIG. 9 is a partially enlarged view of a mounting surface and rib structure of a fourth embodiment.
Figure 10:
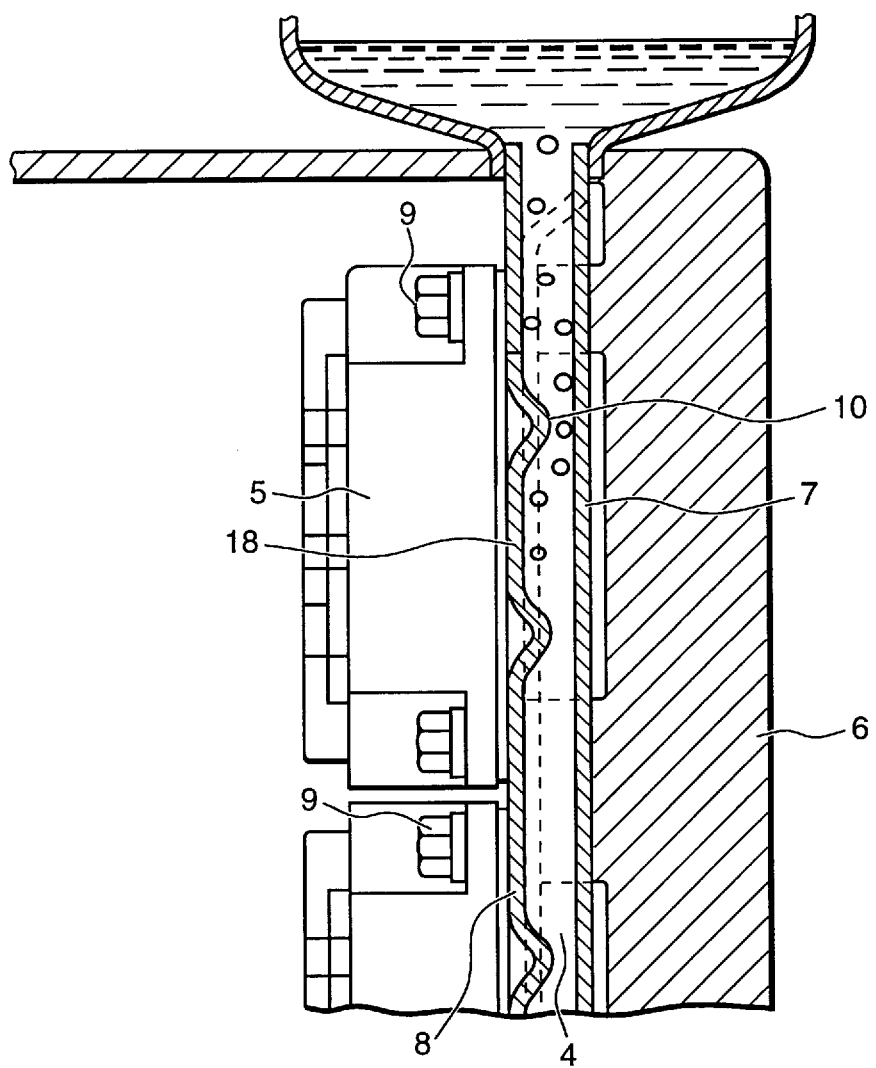
FIG. 10 is a partial cross sectional side view of the cooling apparatus of the fourth embodiment.

The fourth embodiment of the present invention is illustrated in FIGS. 9 through 11. This embodiment also has the same front view of FIG. 1 and the same construction as the first embodiment excluding the following construction. Therefore, the explanation regarding the front view of this apparatus is partly omitted. FIG. 9 shows a rib structure like forming from concave and convex structures or groove structure and so on. FIG. 10 is a partial cross-sectional view of the cooling apparatus in this embodiment. FIGS. 11A–11D shows modified embodiments of various rib structures.

The IGBT modules 5 are mounted on a side surface of the refrigerant tank 4 at two rows each of which has three modules and fastened together to the inverter case 6.

FIG. 9 is an enlarged view of the wall surface of the refrigerant tank 4. Six IGBT modules 5 are mounted on a mounting surface 18 of the thin plate material 8 of the refrigerant tank 4 in FIG. 1. In order to achieve the rib structure which crosses in the center, ribs are recessedly formed by press work. By this X-shape rib structure 10, the rigidity of the mounting surface can be improved, and the deformation thereof can be reduced, and therefore the heat resistance in mounting the IGBT modules 5 can be reduced.

In FIG. 10, the rib structure 10 is so provided as to project to an inner side of the refrigerant tank 4. This arrangement can improve the surface rigidity and increase the surface pressure. For the refrigerant, the rib structure which works as a boiling promotion structure can increase the boiling limit heat flux to be higher than that of the flat plate structure. As a result, cooling with a high heat generation density is possible, and consequently the cooling system can be downsized.

Furthermore, as illustrated in FIG. 10, if the heating elements are mounted at upper and lower (two) levels, a phenomenon that air bubbles generated on the boiling surface of the lower heating elements interfere with air bubbles generated on the boiling surface of the upper heating elements and the heat radiation from the upper heating elements is inhibited, is prevented by diffusing the air bubbles from the lower part due to the rib structure.

FIGS. 11A–11D illustrate embodiments of the rib structures. Since the heat generated by the heating elements flows beneath therefrom, if there is a rib structure on the heating element mounting surface to face the heating elements and the rib structure, the heat radiation characteristics are extremely degraded. However, the rib structure may be of any shape other than X shape illustrated in FIG. 9 unless the ribs cross the heating element mounted positions.

Figure 11B:
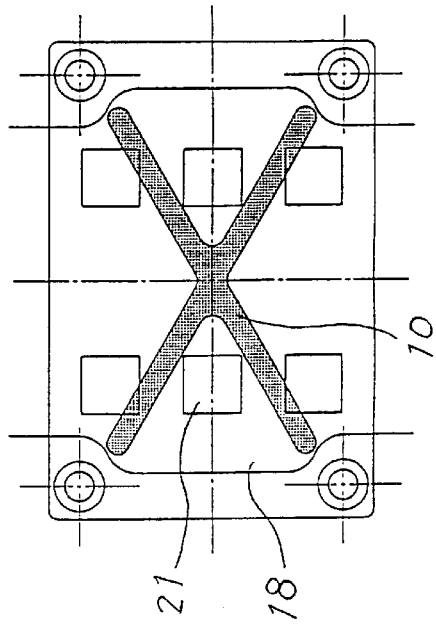
FIGS. 11A–11D are schematic views illustrating modified rib structures.
Figure 11D:
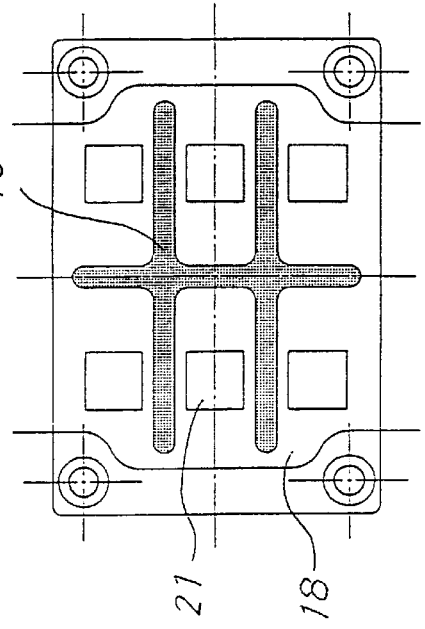
Figure 11A:
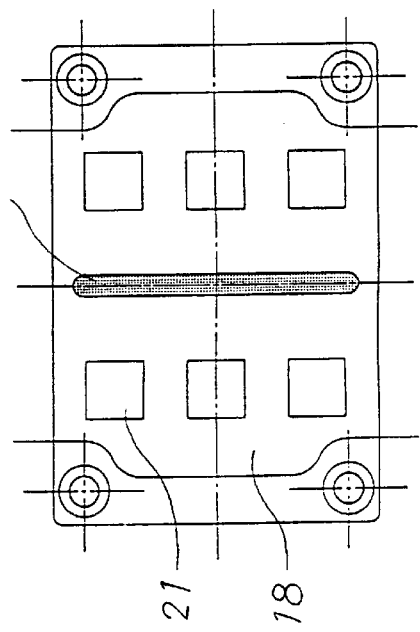
Figure 11C:
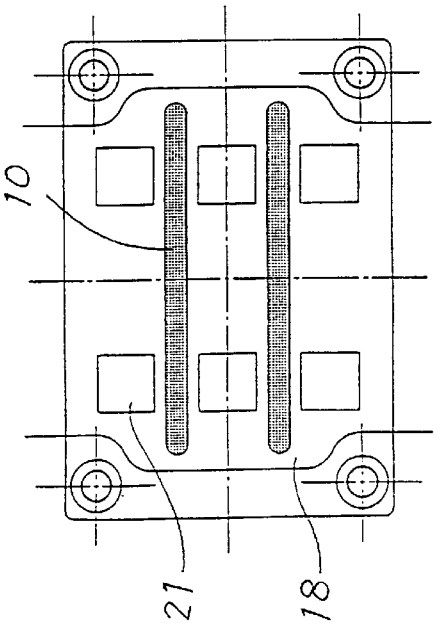

FIGS. 11A–11D illustrate modified embodiments. Squares by solid lines show mounting positions 21 for the heating elements. The rib structures are arranged not to overlap with the mounting positions 21. In FIG. 11A, the rib structure is formed from only one groove. In FIG. 11B, the rib structure is formed from X-shape groove. In FIG. 11C, the rib structure is formed from two parallel grooves. In FIG. 11D, the rib structure is formed from two parallel grooves and one groove crossing perpendicularly.

[EMBODIMENT 5]

FIG. 12 illustrates a fifth embodiment that, for example, the entire mounting surface 18 is first formed to project to form a concave shape toward the heating element 5. By arranging the entire mounting surface 18 to be projected within the elastic deformation range thereof. The solid line indicates the projected shape before mounting the heating element, and the broken line indicates the deformed shaped after mounting the heating element 5. However, the same effect as that of the rib structure can be expected as to the surface rigidity.

[MODIFICATION]

Figure 14:
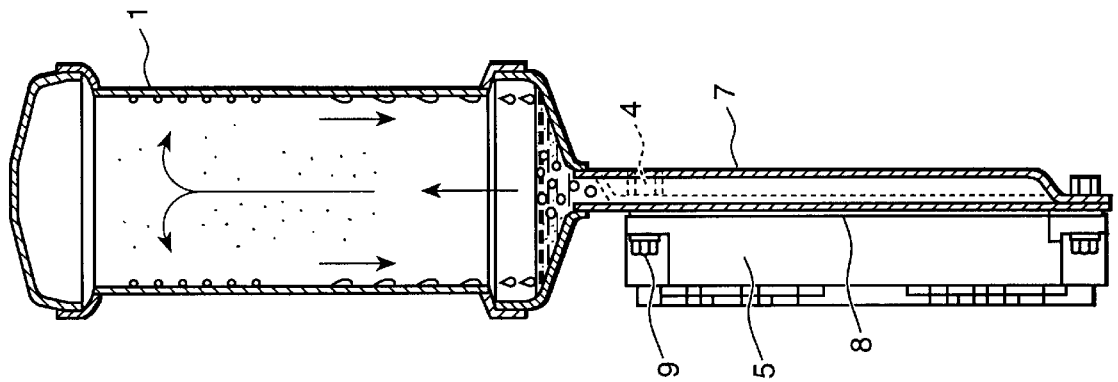
FIG. 14 is a cross sectional side view of the cooling apparatus in FIG. 13 of the modified embodiment of the present invention.
Figure 13:
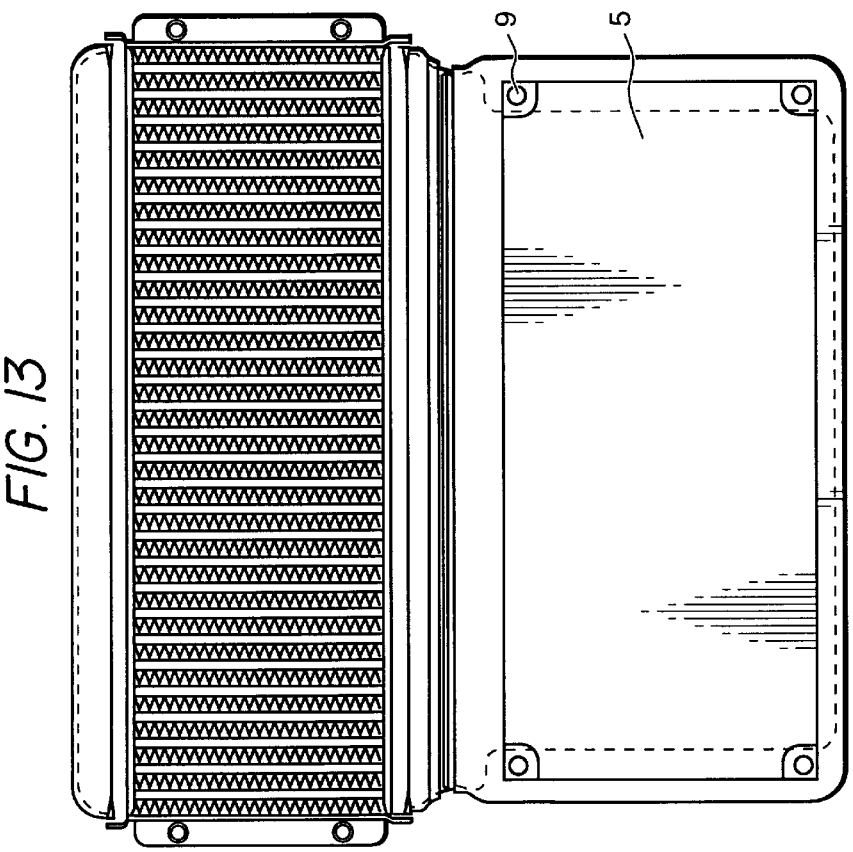
FIG. 13 is a partially cutaway front view to illustrate the cooling apparatus with the heating element of a modified embodiment having only one module of the present invention.

FIGS. 13 and 14 show a front view and a cross sectional side view of the cooling apparatus having an only one IGBT module spreading almost an entire surface of the mounting surface 18 of the thin plate material 7. Therefore, no mounting parts 17 shown in FIG. 7. The IGBT module 5 uses its four corners to be mounted on the thin plate material 7. The thin plate material 8 receives the IGBT module 5 at the joining portion 15 formed outer periphery of the chamber formed in the refrigerant tank 4. The joining portion 15 is not formed except the outer periphery of the chamber.

Figure 16:
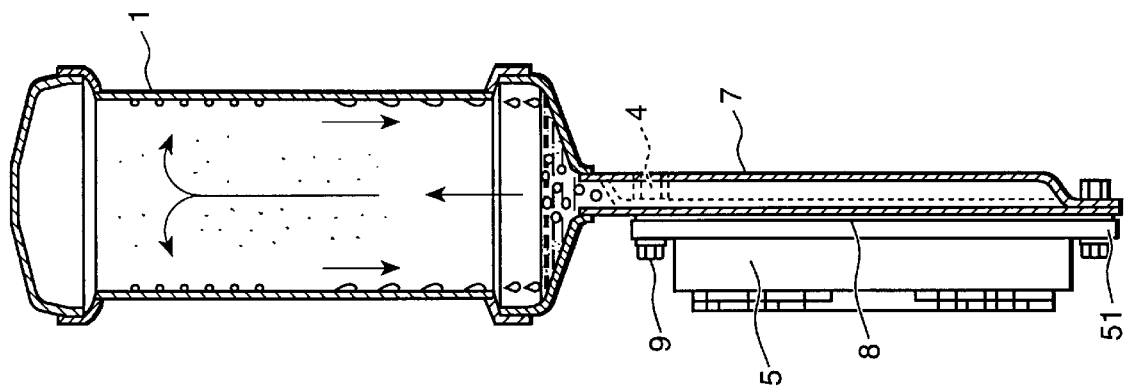
FIG. 16 is a cross sectional side view of the cooling apparatus in FIG. 15 of the modified embodiment of the present invention.
Figure 15:
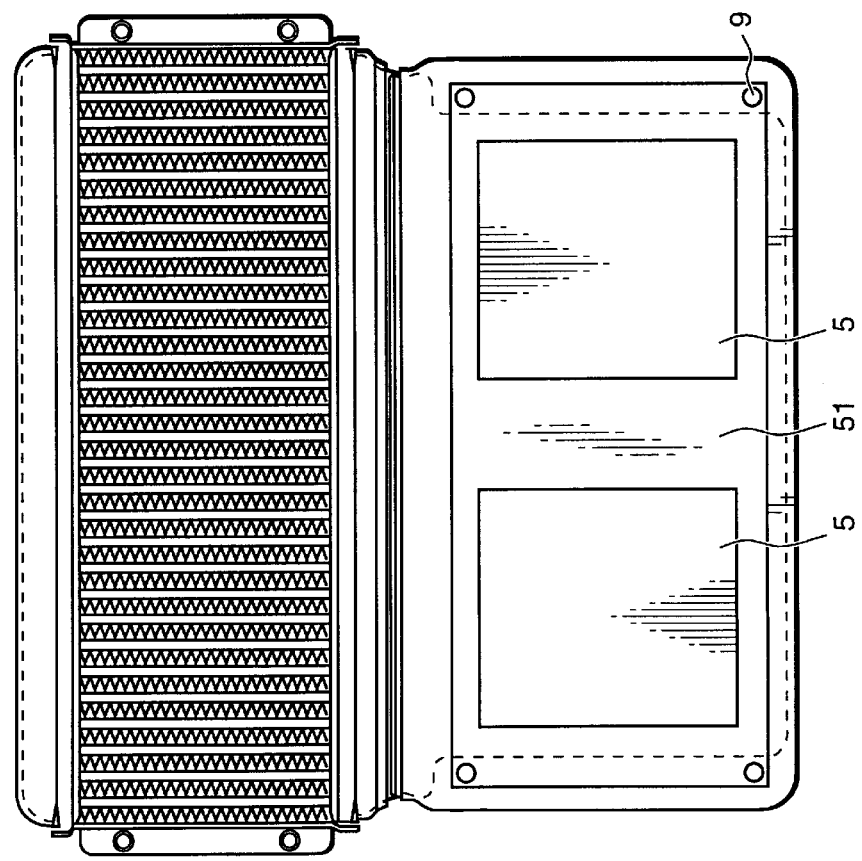
FIG. 15 is a partially cutaway front view to illustrate the cooling apparatus with the heating elements of the modified embodiment having two modules of the present invention.

FIGS. 15 and 16 are a front view and a cross sectional side view of the cooling apparatus having two IGBT modules mounted on a fixing plate 51. The fixing plate 51 has approximately the same thermal expansion coefficient as packages of the IGBT modules 5. In this example two IGBT modules are fixed on the fixing plate 51 by blazing. The fixing plate 51 uses its four corners to be mounted on the thin plate material 8 by using bolts 9. The thin plate material 8 receives the fixing plate 51 with the IGBT module 5 at the joining portion 15 formed outer periphery of a hollow portion formed in the refrigerant tank 4.

Figure 17A:
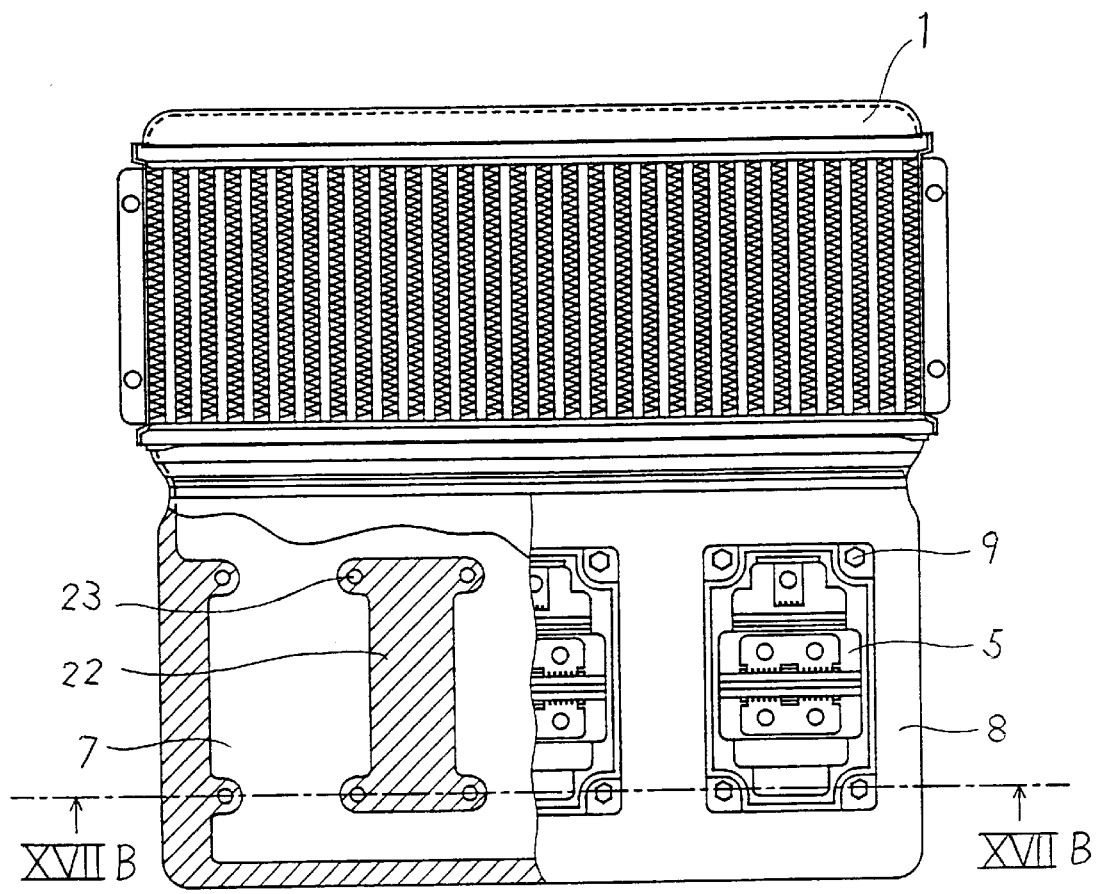
FIG. 17A is a partially cutaway view of the modified embodiment of the cooling apparatus of the present invention.
Figure 17B:
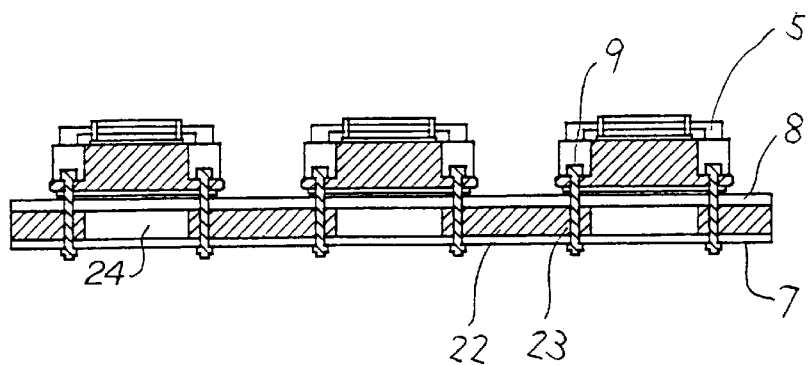
FIG. 17B is a cross sectional view taken along the line XVIIB—XVIIB in FIG. 17A of the cooling apparatus of the modified embodiment of the present invention.

FIGS. 17A and 17B are a partially cutaway front view and a cross sectional view taken along the line XVIIB—XVIIB of the cooling apparatus having spacers between two thin flat plates. In FIGS. 17A and 17B, the thin plate materials are thin flat plates 7 and 8. Between the thin flat plates 7 and 8, spacers 22 are disposed. Through holes 23 are formed to penetrate the flat plate 7, the spacer 22 and the flat plate 8. Between the spacers, spaces 24 are formed. The IGBT modules 5 are disposed on the flat plate 8 to stride over the spaces 24. The spacer 22 and flat plates 7 and 8 which are corresponding to the spacer 22 form the joining portion 15. The IGBT modules 5 are fixed to the joining portion 15 with bolts 9.

As described above, according to the present invention, the refrigerant tank of the cooling apparatus is composed of two thin press forming materials, the refrigerant tank mounting surface 18 for mounting the IGBT modules or the heating elements is arranged to be a rib structure, whereby the mounting surface rigidity can be improved, and a sufficient surface pressure necessary for heat transfer can be obtained. Furthermore, the boiling promotion structure and the air bubble diffusion structure for diffusing air bubbles generated on the boiling surface are arranged to improve the heat radiation ability. Accordingly, by the effects of boiling promotion and air bubble diffusion (stirring), the rigidity of the heating element mounting surface can be improved, and a cooling apparatus having no limit to the maximum heat radiation quantity can be obtained.

What is claimed is:

1. A cooling apparatus using boiling and condensing refrigerant for cooling heating elements generating heat, comprising:

a refrigerant tank formed by joining a plurality of thin plate materials together defining a chamber, refrigerant being sealed in said chamber, each of said plurality of thin plates having a joining portion, said joining portion having at least a through hole, the heating elements being constructed and arranged to be disposed on said thin plate material such that the heating elements may contact the chamber to transfer heat thereto, the refrigerant adsorbing heat generated from the heating elements and being gasified;

a structural member constructed and arranged to cover the heating elements, wherein the refrigerant tank is fixed between the heating elements and the structural member;

a radiation part of tubular shape mounted on said refrigerant tank with one opening completely closed and the other opening communicated with said refrigerant tank for cooling and liquefying the gasified and elevated refrigerant and returning the liquefied refrigerant into said refrigerant tank;

a fastening member for fastening each said heating element and the structural member through said through hole at said joining portion, wherein said plurality of thin plate materials are disposed to oppose mutually, and a part of opposing thin plate materials are completely adhered and bonded together at said joining portion, and said joining portion is formed at one of a part which is recessed and a part which is protruded of said thin plate material.

2. The cooling apparatus according to claim 1, wherein said plurality of thin plate materials are bonded together by brazing.

3. The cooling apparatus according to claim 1, wherein said joining portion forms a mounting portion which is partially widened to enable to install different sizes of said heating elements so that said through hole is formed at various positions corresponding to said different sizes of said heating elements.

4. The cooling apparatus according to claim 1, wherein said joining portion includes an outer joining portion formed at an outer periphery of said refrigerant tank and an inner joining portion for dividing said refrigerant tank into a plurality of cooling chambers.

5. The cooling apparatus according to claim 1, wherein said thin plate materials have a rib portion including convex and concave shape to reinforce said thin plate materials.

6. The cooling apparatus according to claim 5, wherein said rib portion is formed separately from a part to which the heating element is closely adhered at the thin materials.

7. The cooling apparatus according to claim 1, wherein said refrigerant tank is formed to taper off.

8. The cooling apparatus according to claim 1, wherein said thin plate materials are formed from flat plates and spacers are disposed between said flat plates, said joining portion is formed from said flat plates and said spacers which are watertightly bonded together.

9. The cooling apparatus according to claim 1, wherein said refrigerant tank is formed to be flat by bonding said thin plate materials at said joining portion, said heating elements are fixed on an outer surface of said refrigerant tank.

10. The cooling apparatus according to claim 9, wherein said radiation part includes a plurality of hollow members having a flat shape which are arranged in roughly parallel with each other at specified intervals, said hollow members are communicated with said refrigerant tank.

11. The cooling apparatus according to claim 10, wherein a longitudinal length of said refrigerant tank in cross section formed along a plane which is parallel to an air flow flowing into said radiation part is longer than a longitudinal length of respective said hollow member in the similar cross section of said radiation part and a transverse length of said refrigerant tank is shorter than said longitudinal length of respective said hollow member of said radiation part.

12. The cooling apparatus according to claim 9, wherein said joining portion of said refrigerant tank is formed from flat parts disposed at both side ends and lower end of said thin plate materials and said radiation part is mounted on an upper end side of said refrigerant tank.

13. The cooling apparatus according to claim 9, wherein a length from said flat parts formed at the lower end of said thin plate materials to the upper end of said refrigerant tank including said flat parts is longer than the transverse length of said refrigerant tank.

14. The cooling apparatus according to claim 10, further comprising a connection part including a first opening part having a traverse width which is roughly the same as a longitudinal length of respective said hollow members of said radiation part and a transverse length which is roughly the same as said longitudinal length of respective said hollow members of said radiation part when said hollow members are arranged in roughly parallel with each other; and a second opening part having a transverse width which is roughly the same as a longitudinal length of said refrigerant tank and a traverse width which is roughly the same as a traverse length of the refrigerant tank;

wherein said first opening part of said connection part is fittingly connected into said radiation part and said second opening part of said connection part is fittingly connected into said refrigerant tank.

15. The cooling apparatus according to claim 1, wherein said chamber defines a hollow space surrounded by said plurality of thin plate materials joined together with said joining portions to constitute said tank portion.

16. The cooling apparatus according to claim 15, wherein, in said refrigerant tank, said joining portions and said chambers are formed alternately, each of said heating elements having a central portion generating heat and fixing portions positioned at each side of said central portion for fixing said heating elements, said chambers contacting generally with said central portions of said heating elements, and said fixing portions being fixed so as to contact with said joining portions.

17. The cooling apparatus according to claim 16, wherein said plurality of thin plate materials are bonded together by brazing.

18. The cooling apparatus according to claim 16, wherein said joining portion includes an outer joining portion formed at an outer periphery of said refrigerant tank and an inner joining portion for dividing said refrigerant tank into a plurality of cooling chambers.

19. The cooling apparatus according to claim 16, wherein said refrigerant tank is formed to taper off.

20. The cooling apparatus according to claim 16, wherein said radiation part includes a plurality of hollow members having a flat shape which are arranged in roughly parallel relation with each other at specified intervals, said hollow members are communicated with said refrigerant tank.

21. The cooling apparatus according to claim 16, wherein said joining portion of said refrigerant tank is formed from flat parts disposed at both side ends and lower end of said thin plate materials and said radiation part is mounted on an upper end side of said refrigerant tank.

22. The cooling apparatus according to claim 16, wherein a length from a flat parts formed at the lower end of said thin plate materials to the upper end of said refrigerant tank including said flat parts is longer than the transverse length of said refrigerant tank.

* * * * *